United States Patent [19]

Banks et al.

[11] Patent Number: 5,073,478

[45] Date of Patent: Dec. 17, 1991

[54] METHOD OF MAKING A PATTERN

[75] Inventors: Christopher P. Banks, Saffron Walden; Edward Irving, Burwell, both of England

[73] Assignee: Ciba-Geigy Corporation, Ardsley, N.Y.

[21] Appl. No.: 439,724

[22] Filed: Nov. 20, 1989

[30] Foreign Application Priority Data

Nov. 29, 1988 [GB] United Kingdom ............... 8827847

[51] Int. Cl.$^5$ .......................... G03F 7/16; G03F 7/32
[52] U.S. Cl. ..................................... 430/317; 430/313; 430/323; 430/935; 430/271; 204/180.6
[58] Field of Search ............... 430/313, 317, 323, 935; 204/180.6

[56] References Cited

U.S. PATENT DOCUMENTS

| | | | |
|---|---|---|---|
| 3,738,835 | 6/1973 | Bakos | 204/180.6 |
| 4,592,816 | 6/1986 | Emmons et al. | 204/180.6 |
| 4,609,614 | 9/1986 | Pampalone | 430/313 X |
| 4,746,399 | 5/1988 | Demmer et al. | 156/656 |
| 4,795,693 | 1/1989 | Ors et al. | 430/313 X |
| 4,828,964 | 5/1989 | Brunsvold et al. | 430/313 X |
| 4,920,038 | 4/1990 | Budde et al. | 430/313 X |
| 4,927,742 | 5/1990 | Kohm | 430/313 X |

FOREIGN PATENT DOCUMENTS

| | | |
|---|---|---|
| 0255557 | 2/1988 | European Pat. Off. . |
| 0261301 | 3/1988 | European Pat. Off. . |
| 293312 | 2/1986 | U.S.S.R. . |

Primary Examiner—Cynthia Hamilton
Attorney, Agent, or Firm—Luther A. R. Hall

[57] ABSTRACT

A method of making a pattern of an electrically conductive material which comprises (i) electrodepositing on an electrically conductive surface a film comprising a photocurable organic resin, (ii) forming on the electrodeposited film a predetermined pattern of a resist co-cured with with underlying areas of the electrodeposited film by exposure to actinic radiation, thereby leaving predetermined areas of the electrodeposited film uncovered, and (iii) removing the uncovered areas of the electrodeposited film by treatment with a solvent therefor, thereby forming a surface comprising bare conductive material in predetermined areas and, in other predetermined areas, photocured resist securely bonded to the electrically conductive surface through the cured areas of the electrodeposited film covered by the resist.

The method is useful in the production of printed circuits.

12 Claims, No Drawings

METHOD OF MAKING A PATTERN

The present invention relates to a method of making a pattern of an electrically conductive material, particularly metallic patterns such as printed circuits and the like.

It is known, in the production of printed circuits, to form on an electrically conductive surface, usually the copper surface of a copper-clad laminate, a predetermined pattern of a resist using screen or photoimaging techniques. This gives a laminate having bare copper in some areas and copper coated by the resist in remaining areas. Depending on the type of Printed circuit, the laminate may be subjected to various subsequent procedures. For example, solder may be applied directly to the bare copper areas of the laminate by contacting the laminate with molten solder, the resist acting as a solder mask. In another procedure, the bare copper areas of the laminate are plated with a tin-lead alloy, the resist is then removed, the copper exposed by removal of the resist is etched using an etchant which does not remove the tin-lead alloy, and the alloy is then removed using a tin-lead alloy stripper, to leave a copper Pattern on the laminate base. This copper pattern can be further processed by forming thereon a further resist in a Predetermined Pattern to act as a solder mask, and contacting the laminate with molten solder to apply solder to the bare copper areas not covered by the solder mask.

Both of the abovementioned Procedures involve the application of solder by contacting a substrate having a predetermined pattern of a solder mask resist with molten solder in, for example, a wave soldering machine at high temperatures e.g. 200–500° C. The solder mask resist is therefore required to have good adhesion to the areas of the substrate to which solder is not to be applied. There is a continuing need for methods of improving the formation of secure bonds between solder mask resists and the conductive surfaces to which they are applied.

It has now been found that secure bonds between solder mask resists and conductive substrates can be formed in the production of patterns of conductive material by using a photocurable solder mask resist and electrodepositing on the conductive substrate, before application of the solder mask resist, a film of an organic photocurable resin which can be co-cured with the solder mask resist in predetermined areas on exposure of the resist to actinic radiation in those predetermined areas. The areas of the electrodeposited film not covered by the photocured resist can then be removed with a solvent therefor to leave a surface comprising a predetermined pattern of conductive material and a predetermined photocured resist pattern securely bonded to the substrate through the cured areas of the electrodeposited polymer film between the resist and the substrate.

The electrodeposition of a polymer film on bare metal areas of a substrate surface having bare metal in predetermined areas and metal coated by a resist in remaining areas, followed by removal of the resist, etching of the metal thereby exposed and removal of the electrodeposited polymer with a suitable solvent to leave a metal pattern is described in Russian Patent 293 312, U.S. Pat. No. 4,746,399, and European Patent Publications 0 255 557 and 0 261 301. None of these publications suggests the formation on the substrate, after the etching process, of a pattern of a resist which is co-cured with the electrodeposited polymer film.

Accordingly, the present invention provides a method of making a pattern of an electrically conductive material which comprises (i) electrodepositing on an electrically conductive surface a film comprising a photocurable organic resin, (ii) forming on the electrodeposited film a predetermined pattern of a resist co-cured with underlying areas of the electrodeposited film by exposure to actinic radiation, thereby leaving predetermined areas of the electrodeposited film uncovered, and (iii) removing the uncovered areas of the electrodeposited film by treatment with a solvent therefor, thereby forming a surface comprising bare conductive material in predetermined areas and, in other predetermined areas, photocured resist securely bonded to the electrically conductive surface through the cured areas of the electrodeposited film covered by the resist.

Since the Photocurable organic resin deposited in stage (i) and the resist pattern formed in stage (ii) are co-cured, they must be cured by a similar mechanism on exposure to actinic radiation. For example, the electrodeposited resin film and the resist may both be curable by a free radical initiated polymerisation in the presence of a free radical photopolymerisation initiator. In another embodiment, the electrodeposited resin film and the resist may both be curable by photocrosslinking effected by direct activation of photosensitive groups on irradiation. In a further alternative, the electrodeposited resin film and the resist may both be curable by cationic polymerisation in the presence of a cationic photopolymerisation initiator.

Materials useful as resists which are crosslinked by direct activation of photosensitive groups on exposure to actinic radiation are well known. They include, for example, film-forming resins having stilbene, maleimido, chalcone, propenone, pentadienone or cinnamate groups. These resins may be used as the resist in step (ii) of the process of the invention when resins having similar co-crosslinkable groups together with salt-forming groups are used as the electrodeposited resin in step (i). The electrodeposited resins may be derived from the resins used as the resist by carrying out known reactions to introduce salt-forming groups. For example, where a resin to be used as the resist contains, in addition to the photosensitive group, an epoxide group, the latter may be reacted with a secondary amine or a polycarboxylic acid to introduce a tertiary amine group or a carboxylic group respectively. When the resin to be used as the resist contains a hydroxyl group, for example, it may be reacted with a polycarboxylic acid anhydride to introduce a carboxylic group.

When the electrodeposited resin films and resists having directly activatable photosensitive groups are used in the process of the invention, both the electrodeposited film and the resist preferably comprise a resin containing an alpha, beta-ethylenically unsaturated ester or ketone group having aromaticity or ethylenic unsaturation in conjugation with the alpha, beta unsaturation, the electrodeposited resin having a salt-forming group, preferably a carboxyl or amino group. For example, the electrodeposited film may comprise an adduct of an epoxide resin and cinnamic acid or sorbic acid which has been modified by reaction of the secondary hydroxyl groups thereof with a polycarboxylic acid anhydride, such as adipic or glutaric anhydride, to introduce carboxyl groups, while the resist comprises a polyvinyl cinnamate or an adduct of an epoxide resin and cinnamic acid.

In preferred embodiments when the electrodeposited film and the resist comprise resins having conjugated alpha, beta unsaturation, the electrodeposited film preferably comprises a reaction product of an epoxide resin containing an alpha, beta-ethylenically unsaturated ketone group having aromaticity or ethylenic unsaturation in conjugation with the alpha, beta unsaturation and a secondary monoamine. In such embodiments the resist preferably comprises an epoxide resin having such a conjugated unsaturated ketone group. The epoxide resin used as the resist and from which the electrodeposited resin film is derived may contain, for example, a chalcone or phenyl-substituted propenone group or, preferably, at least one 1,5-bisphenylpenta-1,4-dien-3-one group. Especially preferred such epoxide resins are a polyglycidyl ether of a 1,5-bis(hydroxyphenyl)-penta-1,4-dien-3-one and advancement reaction products thereof with a bisphenol, preferably bisphenol A and/or tetrabromobisphenol A or a hydantoin, preferably 5,5-dimethylhydantoin, or advancement reaction products of a bisphenol diglycidyl ether or a N,N'-diglycidyl hydantoin with a bis(hydroxyphenyl)Penta-1,4-dien-3-one.

Reaction Products of epoxide resins containing such conjugated unsaturated ketone groups with a secondary monoamine suitable for use as electrodepositable photocurable resins in the process of the invention are believed to be novel. They may be prepared by subjecting the reactants to conventional epoxide-amine reaction procedures, for example by heating them in an inert solvent at 50–120° C. The secondary monoamine may be, for example, a dialkylamine such as diethylamine, di-n-propylamine, di-isopropylamine, di-n-butylamine, di-isobutylamine, di-n-amylamine, di-isoamylamine, di-n-hexylamine, di-n-octylamine, and di-n-dodecylamine, an alkanolamine such as diethanolamine, N-methylathanolamine, N-butylethanolamine, diisopropanolamine, N-methylisopropanolamine or di-n-butanolamine, or a nitrogen heterocycle such as piperidine or morpholine. Alkanolamines are preferred.

Preferred electrodepositable photocurable resins are of formula $$R^1[CH_2CH(OH)CH_2N(R^2)R^3]_2 \qquad I$$

where
R$^1$ denotes the residue, after removal of two epoxide groups, of an epoxide resin containing an alpha, beta-ethylenically unsaturated ketone group having aromaticity or ethylenic unsaturation in conjugation with the alpha, beta unsaturation, preferably a 1,5-bis(oxyphenyl)penta-1,4-dien-3-one group, i.e. a group of formula $$-O-Ar^1-CH=CH-CO-CH=CH-Ar^1-O- \qquad II$$

where Ar$^1$ denotes an unsubstituted or substituted phenylene group, and
R$^2$ and R$^3$ each denote an alkyl group of 1 to 12 carbon atoms, optionally substituted by a hydroxyl group, or R$^2$ and R$^3$ together with the indicated nitrogen atom form a 5- or 6-membered heterocyclic ring.

In Preferred resins of formula I,
R$^1$ denotes a group of formula

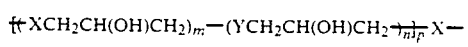

or

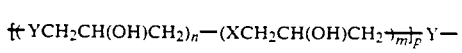

where
X denotes a group of formula II in which Ar$^1$ denotes an unsubstituted phenylene group,
Y denotes a group of formula

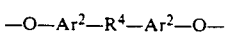

or

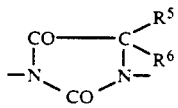

Ar$^2$ denotes an unsubstituted or substituted phenylene group, preferably an unsubstituted or halogen-substituted phenylene group,
R$^2$ and R$^3$ each denote a hydroxyl-substituted alkyl group of 2 to 4 carbon atoms,
R$^4$ denotes an alkylene group of 1 to 3 carbon atoms,
R$^5$ and R$^6$ each denote a hydrogen atom or an alkyl group of 1 to 4 carbon atoms, and
m, n and P are each a Positive integer, and are such that the resin has a number average molecular weight of 500 to 10,000.

The resins of formula I may be prepared by reacting an epoxide resin of formula

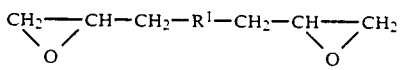

with the a secondary monoamine of formula $$HN(R^2)R^3 \qquad VIII$$

where R$^1$, R$^2$ and R$^3$ are as hereinbefore defined, under conventional conditions for epoxide-amine reactions.

Epoxide resins of formula VII where R$^1$ denotes a group of formula III may be prepared by advancing an epoxide resin of formula

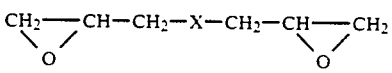

by reaction with a compound of formula $$H-Y-H \qquad X$$

where X and Y are as hereinbefore defined, using conventional epoxide resin advancement reaction procedures.

Similarly, epoxide resins of formula VII where R$^1$ denotes a group of formula IV may be prepared by conventional advancement reactions of an epoxide resin of formula

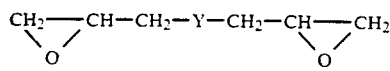

with a bisphenol of formula

 XII where X and Y are as hereinbefore defined.

Suitable epoxide resins of formulae IX and XI, bisphenols or hydantoins of formula X, bisphenols of formula XII and amines of formula VIII may be as hereinbefore described.

Electrodeposited resin films which are curable by free radical initiated polymerisation preferably contain polymerisable acrylic groups together with a salt-forming group, particularly a carboxyl group or a tertiary amino group. They may be used when the resist comprises a material having free radical polymerisable groups. Such electrodeposited resin films are well known. They include, for example, reaction products of polycarboxylic acid anhydrides such as adipic or glutaric anhydride with adducts of epoxide resins, such as a diglycidyl ether of bisphenol A, and acrylic or methacrylic acid; Products obtained by reacting the epoxide groups of epoxide resins such as a diglycidyl ether of bisphenol A partially with acrylic or methacrylic acid and partially with a secondary amine such as diethanolamine or the other secondary monoamines hereinbefore described; and products obtained by subjecting part of the acrylate or methacrylate group content of a resin containing acrylate or methacrylate groups to a Michael addition reaction with a secondary amine such as diethanolamine o the other secondary monoamines hereinbefore described.

Preferred such free radical photopolymerisable electrodeposited films comprise a mixture of a polymer having a salt-forming group, preferably a carboxyl or tertiary amino group, with a material having, on average, more than one polymerisable acrylic group per molecule. Preferred mixtures of this kind are mixtures of an acrylic polymer having a carboxyl and/or a tertiary amine group with a monomer having at least two acrylate or methacrylate groups. Suitable acrylic polymers include homopolymers of monoacrylic monomers containing a carboxyl or tertiary amino group, such as acrylic or methacrylic acid, adducts of a hydroxyalkyl acrylate or hydroxyalkyl methacrylate with a polycarboxylic acid anhydride, dialkylaminoalkyl acrylates or dialkylaminoalkyl methacrylates, and copolymers of such monoacrylic monomers with each other and/or with at least one monoacrylic ester free from carboxyl or tertiary amino groups, optionally together with at least one other vinyl monomer.

Acrylic and methacrylic acids are particularly preferred carboxyl-containing monoacrylic monomers. A particularly preferred tertiary amino-containing monoacrylic monomer is 2-(dimethylaamino)ethyl methacrylate. Carboxyl-free and tertiary amino- free monoacrylic esters preferred for copolymer formation include alkyl acrylates, alkyl methacrylates, hydroxyalkyl acrylates and hydroxyalkyl methacrylates such as methyl acrylate, ethyl acrylate, n-butyl acrylate, n-hexyl acrylate, 2-ethylhexyl acrylate, 2-hydroxyethyl acrylate, 2-hydroxypropyl acrylate, 3-hydroxypropyl acrylate and the corresponding methacrylates. The optional vinyl monomer which may be used in copolymer formation may be, for example, a vinyl ester such as vinyl acetate, a vinyl halide such as vinyl chloride or, preferably, a styrene such as styrene, alpha-methyl styrene or p-chlorostyrene, styrene itself being particularly preferred.

The acrylic polymers may be prepared by conventional polymerisation processes using free radical polymerisation initiators such as peroxides or azo compounds, usually to give polymers having a number average molecular weight of 5000 or more, preferably 5000 to 50,000. Thus the monomers may be heated with the initiator in solution in an organic solvent, preferably a solvent which is miscible with the medium from which the polymer is to be electrodeposited. Conventional chain transfer agents such as tert.dodecyl mercaptan can be used when desired.

Materials containing, on average, more than one polymerisable acrylic group Per molecule suitable for use in admixture with the acrylic polymer in the electrodeposited film include esters of acrylic or methacrylic acid, or a carboxyl-containing adduct of a hydroxyalkyl acrylate or methacrylate and a polycarboxylic acid anhydride, with a polyhydric alcohol, which can be a low molecular weight alcohol or a film-forming resin. or with an epoxide resin; and acrylic urethane reaction products of isocyanate-terminated polyurethane prepolymers with a hydroxyalkyl acrylate or hydroxyalkyl methacrylate. Preferred such polymerisable acrylic materials are monomers containing at least two acrylate or methacrylate groups, particularly esters of acrylic acid or methacrylic acid with polyhydric alcohols having 2 to 6 hydroxyl groups, including aliphatic polyhydric alcohols having up to 12 carbon atoms, for example diols, such as ethylene, 1,2-propylene, trimethylene, tetramethylene, neopentyl, hexamethylene, octamethylene and dodecamethylene glycols, and oxyalkylene glycols such as di-, tri-, and tetra-ethylene glycols and tri(propylene glycol), triols such as glycerol and 1,1,1-trimethylolpropane, and tetrols such a erythritol and pentaerythritol; cycloaliphatic polyhydric alcohols such as di- or tri-hydroxymethyl-substituted cyclohexanes; heterocyclic polyhydric alcohols such as tris(2-hydroxyethyl) isocyanurate; and aromatic polyhydric alcohols such as dimethylol- and trimethylol-benzenes and 2.2-bis(p-(2-hydroxyethoxy)phenyl)propane. Many of these acrylates and methacrylates are commercially available. Those that are not can be made by conventional processes, for example by esterifying the polyhydric alcohol with acrylic or methacrylic acid or an esterifying derivative thereof such as acryloyl chloride or methacryloyl chloride.

When the electrodeposited resin film comprises polymerisable acrylic groups, the resist preferably comprises material having, on average, more than one polymerisable acrylic group per molecule. Suitable materials include the resins containing polymerisable acrylic groups and mixtures of an acrylic polymer and a monomer having at least two polymerisable acrylic groups hereinbefore described as suitable for inclusion in the electrodeposited resin film. Also suitable are materials containing epoxy groups and acrylate or methacrylate groups as described in U.S. Pat. No. 4,548,895. Photocurable adducts of epoxy resins and acrylic or methacrylic acid suitable for use as resists are well known and widely available from various commercial sources. Preferably the resist is developable in aqueous alkali and comprises a material having polymerisable acrylic groups and at least one carboxyl group. Such materials are described in British Patent Specification 1 474 715. Preferred such aqueous alkali-developable resists containing acrylate groups and carboxyl groups are those available from Du Pont under the RISTON trade mark.

When the electrodeposited resin film and the resist comprise free radical polymerisable materials, either the electrodeposited resin film or the resist must contain a free radical photopolymerisation initiator. Preferably, both the electrodeposited film and the resist contain such an initiator. Suitable such photoinitiators are well known and many different types are commercially available. Any of the known types can be used in a conventional amount, generally from 0.1 to 20%, preferably 1 to 10%, by weight of the polymerisable material. Thus the photopolymerisation initiator may be an aromatic carbonyl compound, for example a benzoin, a benzoin alkyl ether such as the isopropyl or n-butyl ether, an alpha-substituted acetophenone, for example a benzil dialkyl ketal such as benzil dimethyl ketal, an alpha-haloacetophenone such as trichloromethyl P-tert-.butylphenyl ketone, an alpha-aminoacetophenone such as dimethylaminomethyl phenyl ketone and morpholinomethyl phenyl ketone, a dialkoxyacetophenone such as dialkoxyacetophenone, or an alpha-hydroxyacetophenone such as 1-hydroxycyclohexylphenyl ketone or a benzophenone such as benzophenone itself and bis(4-dimethylaamino)benzophenone; a metallocene, for example a titanium metallocene such as bis(-pimethylcyclpentadienyl)bis(sigma-pentafluorophenyl) titanium (IV). a group IVA organometallic compound, for example a stannane such as trimethyl benzyl stannane, tributyl benzyl stannane or dibutyl benzyl stannane, together with a photoreducible dye, typically methylene blue or rose bengal; a quinone, such as anthraquinone or camphorquinone, together with an amine having hydrogen attached to an aliphatic alpha carbon atom, preferably a tertiary amine such as bis(4-dimethylaamino)benzophenone and triethanolamine; a thioxanthone, for example an alkyl- or halogen-substituted thioxanthone such as 2-isopropylthioxanthone or 2-chlorothioxanthone; an acyl phosphine oxide; or a mixture of two or more thereof.

When the resist comprises a cationically polymerisable material together with a cationic photoinitiator therefor, the electrodeposited resin film may comprise a resin comprising epoxide groups and a salt-forming group, preferably a tertiary amine group. Suitable such resins include those obtained by reacting a secondary monoamine with part of the glycidyl group content of a copolymer of a monoacrylic monomer containing a glycidyl group, preferably glycidyl acrylate or glycidyl methacrylate, with at least one other vinyl monomer. The latter is preferably selected from alkyl acrylates and alkyl methacrylates such as those hereinbefore described, hydroxyalkyl acrylates and hydroxyalkyl acrylates such as those hereinbefore described, styrenes such as those hereinbefore described, and mixtures of two or more thereof. The secondary monoamine reacted with the glycidyl-containing copolymer may be a dialkylamine, an alkanolamine or a nitrogen heterocycle as hereinbefore described, diethanolamine being particularly preferred.

Cationically photocurable compositions suitable for use as the resist are known. Preferred such compositions include those comprising an epoxide resin together with an onium salt, a metallocenium salt or an aromatic iodosyl salt. Photocurable compositions of this type are also described in U.S. Pat. No. 4,572,890 and in EP-A-0 094 915. Particularly preferred compositions are those containing a polyglycidyl ether of a polyhydric phenol, such as a Phenol-formaldehyde novolak or, preferably, a bisphenol, particularly bisphenol A, or a cycloaliphatic epoxide resin, that is an epoxide resin having an epoxide group incorporating adjacent carbon atoms in a cycloaliphatic ring such as vinylcyclohexene dioxide or, preferably, 3,4-epoxycyclohexylmethyl-3'4'-epoxycyclohexanecarboxylate, or a mixture of such a polyglycidyl ether and such a cycloaliphatic resin, together with an onium or iodosyl salt, preferably a sulphonium or sulphoxonium salt, as cationic photoinitiator.

In the method of this invention, the electrodeposited photo-curable resin film and the resist may include conventional photo-sensitisers and other additives used in conventional photoresists such as dyes and non-photosensitive film-forming polymers.

Electrodeposition of the resin film in stage (i) of the method of the invention may be carried out using conventional procedures from an aqueous electrodeposition medium containing the photocurable organic resin in at least partially ionised form. Thus the electrodepositable resin, optionally together with conventional additives such as pigments, dyes, fillers and plasticizers, can be dissolved or dispersed in an aqueous medium, which may contain a minor amount of an organic solvent, together with an acid or base to at least Partially neutralise salt-forming groups on the resin. If desired, salt-forming groups on the resin may be at least partially neutralised Prior to dissolution or dispersion in the electrodeposition medium. The aqeous electrodeposition medium generally contains from 2 to 60%, Preferably from 5 to 25%, by weight of the Photocurable organic resin. The conductive surface on which the resin film is to be electrodeposited can be immersed in the electrodeposition medium as an anode or cathode, depending on whether the resin is anodically or cathodically depositable, another electrode of opposite charge immersed in the medium and a current passed between the electrodes to electrodeposit the resin on the required electrode.

Electrodeposition for up to a few minutes, usually up to one minute, at a voltage of up to 200 volts is sufficient in most cases. Voltages as low as 2 volts may be used in some cases, especially if the size of the electrode on which the resin film is deposited is small in relation to the other electrode. For example, a cathodically depositable resin may be deposited on a small cathode in a metal tank where the whole of the tank is the anode, at voltages of 2 volts or 5 volts. If desired, electrodeposition can be effected under constant current or constant voltage conditions. Adhesion of the resin film may sometimes be improved if it is deposited under constant current conditions, the voltage being increased as electrodeposition proceeds. For example, a good coating can be obtained by electrodepositing the resin at 2 volts for 2 minutes, followed by deposition at 5 volts for up to 5 minutes.

Step (ii) of the method of the invention may be carried out by
  (a) applying a layer of the resist over the electrodeposited film,
  (b) irradiating the resist layer with actinic radiation in a predetermined pattern, thereby photocuring the resist and the underlying electrodeposited film in exposed areas, and (c) removing unexposed areas of the irradiated resist layer.

Irradiation of the photocurable resist layer in a predetermined pattern may be achieved by exposure through an image-bearing transparency consisting of substantially opaque and substantially transparent areas, or by means of a computer-controlled laser beam. Electromagnetic radiation having a wavelength of 200–600 nm is generally used, and suitable sources include carbon arcs, mercury vapour arcs, fluorescent lamps with phosphors emitting ultra violet light, argon and xenon glow lamps, tungsten lamps, and photographic flood lamps; of these, mercury vapour arcs and metal halide lamps are the most suitable. The exposure time required depends on such factors as the nature of the components of, and the thickness of, the photocurable resist layer, the type of radiation source, and its distance from the resist layer. Suitable exposure times can readily be found by routine experimentation.

Removal of the unexposed areas of the irradiated resist layer is preferably effected by treatment with a solvent. This solvent is chosen according to the nature of the photocurable resist, and may be water, an aqueous or aqueous organic solution of an acid or base or an organic solvent or mixture of solvents. Suitable acid solutions include those of acetic, lactic, glycolic or toluene-p-sulphonic acids, while suitable base solutions include those of sodium or potassium hydroxide or carbonate. Suitable organic solvents include hydrocarbons such as toluene and xylene, halohydrocarbons such as 1.1.1-trichloroethane and dichloromethane, hydroxylic solvents such as ethanol, 2-n-butoxy-ethanol 2-ethoxyethanol, and diethylene glycol monobutyl ether (butyl digol), esters such as 2-ethoxyethyl acetate and propylene carbonate, ketones such as cyclohexanone, acetone and methyl ethyl ketone, ethers such as tetrahydrofuran and lactones such as gamma-butyrolactone.

The solvent can be chosen so that the removal of the unexposed areas of the photocurable resist layer also effects step (iii) of the method of the invention, i.e. the removal of the uncovered areas of the electrodeposited film. Where the solvent used for removal of the unexposed areas of the resist does not remove the uncovered areas of the electrodeposited film, another solvent is used to effect step (iii). This solvent can also be chosen from those hereinbefore specified for removal of the unexposed areas of the resist layer; a suitable solvent can be found by routine experimentation.

The method of the invention is particularly suitable for the production of metallic patterns starting from a substrate having a surface comprising bare metal in Predetermined areas and metal coated by a preformed resist in remaining areas, the bare metal surface being the electrically conductive surface hereinbefore specified in the definition of step (i) of the method of the invention. In this embodiment of the invention, between steps (i) and (ii) the preformed resist may be removed from said remaining areas using a solvent which does not remove the electrodeposited film and metal thereby exposed in said remaining areas etched using an etchant which does not remove the electrodeposited film.

The Preformed resist present as a coating on the initial substrate may be an epoxide resin applied by a screen printing process and then cured. Preferably, the preformed resist is a photoresist coated in selected areas by applying it uniformly to the substrate, which is usually a copper-clad Plastics laminate, subjecting it to actinic radiation in a predetermined pattern and then removing exposed or unexposed areas according to whether the photoresist is positive or negative respectively positive and negative photoresists for use in making printed circuit boards are well known materials and any of them may be used. They can be removable under aqueous conditions or by means of an organic solvent. A layer of another metal such as tin-lead solder or nickel may be deposited on bare copper areas before electrodeposition of the photocurable film.

It is possible to use a combination of preforated photoresist and an electrodeposited film which are both removable under acidic aqueous conditions or both removable under basic aqueous conditions provided that the photoresist is removable under milder conditions than are needed to remove the electrodeposited film, e.g. a more dilute solution of acid or base. It is also possible to use a preformed resist and an electrodeposited film which are removable by different organic solvents. It is particularly preferred that the preformed resist and the electrodeposited film are chosen so that the preformed resist is removed using an aqueous solvent and the electrodeposited film is removed in step (iii) using an organic solvent.

Metal exposed by removal of the preformed resist, usually copper, may be removed by any well known etchant such as ferric chloride, hydrogen peroxide/phosphoric acid, ammonium persulphate, or cupric chloride. After etching, the substrate has a surface comprising predetermined areas of metal covered by the electrodeposited polymer film and predetermined areas from which the metal has been removed by the etching process. Where the initial substrate is a copper-clad plastics laminate, after the etching the surface comprises predetermined areas of copper covered by the electrodeposited film and areas in which the laminate base is devoid of copper.

The method of the invention is particularly suitable for the production of printed circuits, including multilayer printed circuits having plated through holes or vias. The photocured resist formed in a predetermined pattern on the electrodeposited film in step (ii) may act as a solder mask during subsequent processing of the printed circuit.

The invention is illustrated by the following Examples, in which parts and percentages are by weight unless otherwise indicated.

The resins used in the Examples are prepared as follows:

Resin I

A 50% solution in a mixture of 2-ethoxyethyl acetate and 2-methoxyethanol (weight ratio 2:1) of an epoxide resin obtained by advancing 1.5-bis(4-glycidyloxyphenyl)Penta-1,4-dien-3-one with bisphenol A and tetrabromobisphenol A, having a number average molecular weight of 3400–3500 and an epoxide content of 0.8 equiv./kg (70 parts) is heated to 130° C. Diethanolamine (3.14 parts) is added and the mixture is stirred at 130° C. for 4 hours, by which time the epoxide content is negligible. The mixture is then cooled to 90° C. and aqueous 20% lactic acid (2.16 parts) is added. The resulting product is cooled to ambient temperature.

The resin obtained by evaporating the solvent under vacuum at 130° C. from the solution obtained before addition of lactic acid has the following characteristics:
Amine Value: 0.61 eq/kg
Softening Point (Kofler Hot Bench): 105° C.

IR (KBr disc) 3420, 3160, 2940, 2880, 1760, 1645, 1602, 1572, 1510, 1455, 1425, 1250, 1171, 1096, 1035, 830, 640cm$^{-1}$.

MNR (DMSO-d$_6$) 1.1(t), 1.6(s), 2.0(s), 2.5(m), 3.3-4.5(m), 6.8-7.9(m) δ.

Resin II

A monomer mixture consisting of styrene (47.5 Parts), 2-ethylhexyl acrylate (25 parts), 2-hydroxyethyl-methacrylate (20 parts) and dimethylaminomethyl methacrylate (7.5 parts) with azobis(isobutyronitrile) (1.5 Parts) is added dropwise over 2 hours to 2-n-butoxyethanol (50 parts) stirred under nitrogen at 100° C. The reaction mixture is maintained at 100° C. for a further 1 hour and a further charge of azobis(isobutyronitrile) (0.5 parts) and 2-n-butoxyethanol (5.5 parts) added. This procedure—maintenance at 100° C. for one hour followed by addition of the further charge—is repeated twice more and the reaction mixture held at 100° C. for a further 1 hour and then cooled. The copolymer in the resulting solution has a number average molecular weight of 10,416.

Resin III

A 40% solution in 2-ethoxyethanol of an epoxide resin obtained by advancing 1,5-bis(4-glycidyloxyphenyl)penta-1,4-dien-3-one with 5,5-dimethylhydantoin and having an epoxide content of 0.7-1.0 equiv./kg (92.6 parts) is heated to 130° C. Diisopropanolamine (2.66 parts) is added and the mixture is stirred at 130° C. for 5 hours by which time the epoxide content is negligible. The mixture is then cooled to 90° C. and aqueous 20% lactic acid (1.2 parts) is added. The resulting product is cooled to ambient temperature.

The resin obtained by evaporating the solvent under vacuum at 130° C. from the solution obtained before addition of lactic acid has the following characteristics:

Amine Value: 0.40 eq/kg
Softening Point : 108° C.

IR (KBr disc) 3400, 2980, 2940, 2880, 1770, 1710, 1645, 1600, 1571, 1512, 1460, 1425, 1255, 1171, 1095, 1031, 988, 832, 640 cm$^{-1}$.

NMR (DMSO-d$_6$) 0.9-1.5(m), 2.5(s), 3.3-4.2(m), 6.8-7.9(m) δ.

Resin IV

A monomer mixture consisting of glycidyl methacrylate (30 parts), styrene (30 parts), 2-hydroxyethyl methacrylate (5 parts), 2-ethylhexyl acrylate (35 parts) and azobis(isobutyronitrile) (1.5 parts) is added dropwise over 2 hours to 2-n-butoxyethanol (50 parts) stirred at 100° C. The reaction mixture is maintained at 100° C. for a further hour and a further charge of azobis-(isobutyronitrile) (0.5 part) and 2-n-butoxyethanol (5.5 parts) is added. This procedure—maintenance at 100° C. for one hour followed by addition of the further charge—is repeated twice more and the reaction mixture is held at 100° C. for a further hour and then cooled. The amine value of the resulting solution is 0.30 eq/kg, the epoxide content is 0.85 eq/kg and the solids content is 58.6%.

The RISTON 3415 photoresist used in the Examples is an aqueous developable photocurable acrylate group-containing dry film resist incorporating a free radical photopolymerisation initiator available from Du Pont (UK) Ltd., Riston Division, Wedgewood Way, Stevenage, Hertfordshire SG1 4QN, England.

The HOECHST HB 1160 DRY FILM STRIPPER used in the Examples is available from Hoechst U.K. Ltd., Electronic Products Division, Unit 20, Smiths Industrial Estate, Humber Avenue, Coventry, CV3 1JR, England.

EXAMPLE 1

A copper-clad laminate coated with RISTON 3415 aqueous developable photoresist, which has been imaged and developed to form a pattern in the photoresist is used as the cathode in an electrodeposition bath equipped with a stainless steel anode and containing a solution of Resin I (100 parts) in a mixture of water (339 parts) and 2-n-butoxyethanol (48.8 parts). A voltage of 55 volts is applied for 4 seconds and the laminate is then removed from the bath, rinsed with water and dried at 80° C. for 10 minutes. The electrodeposited film coats the areas where there is no photoresist and the copper is exposed. The laminate is then immersed in an aqueous 7% solution of ethanolamine at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C, after which the laminate is washed in water and dried, to leave a clear pattern, in copper covered with electrodeposited film, on the laminate base. A layer of the epoxide resin used as the starting material for the preparation of Resin 1 is applied as a solder mask resist over the surface having the copper pattern using a wire-wound rod. The solder mask is dried at 80° C. for 10 minutes and then irradiated through an image-bearing transparency using a 5kW metal halide lamp at a distance of 75 cm for 2 minutes. The irradiation co-cures the exposed areas of the solder mask and the areas of the electrodeposited film underlying these exposed areas. The laminate is immersed in a mixture of propylene carbonate (50 parts), gamma-butyrolactone (20 parts) and butyl digol (diethylene glycol monobutyl ether) (30 parts) to remove areas of the solder mask not exposed in the imagewise irradiation and the electrodeposited resin thus exposed in those areas. The resulting laminate has a Pattern of photocured solder mask securely bonded to the underlying copper pattern through the cured intermediate electrodeposited film.

EXAMPLE 2

A copper-clad laminate coated with RISTON 3415 aqueous developable photoresist, which has been imaged and developed to form a pattern in the photoresist, is used as the cathode in an electrodeposition bath equipped with a stainless steel anode and containing Resin II (100 Parts), aqueous 20% lactic acid (6.7 parts), trimethylolpropane trisacrylate (22.5 parts), benzil dimethyl ketal (1.5 parts) in water (469.3 parts). A voltage of 20 volts is applied for one minute and the laminate is then removed from the bath, rinsed with water and dried at 110° C. for 5 minutes. The electrodeposited film coats the areas where there is no photoresist and the copper is exposed. The laminate is then immersed in an aqueous 7% solution of ethanolamine at 50° C. This treatment removes the photoresist leaving the electrodeposited film. The copper exposed by removing the photoresist is etched away in a solution of concentrated sulphuric acid (20 parts) and ammonium persulphate (150 parts) in water (830 parts) at 50° C., after which the laminate is washed in water and dried, to leave a clear pattern, in copper covered with the electrodeposited film, on the laminate base. A layer of RISTON 3415 aqueous developable photocurable acrylate-containing photoresist is applied over the surface bearing the copper pattern using a dry film laminator. The photoresist is irradiated through an image-bearing transparency using a 5kW metal halide lamp at a distance of 75 cm for 60 seconds to co-cure the exposed areas of the resist and the underlying areas of the electrodeposited film. The laminate is immersed in an aqueous 1% solution of sodium carbonate to remove the areas of the photoresist not exposed in the imagewise irradiation. The electrodeposited film thus exposed is removed by immersion in 1,1,1-trichloroethane. The resulting laminate bas a pattern of photocured solder mask securely bonded to the underlying copper pattern through the cured intermediate electrodeposited film.

EXAMPLE 3

A copper-clad laminate coated with RISTON 3415 aqueous developable negative photoresist is imaged and developed to form a pattern in the photoresist. The copper exposed on development is electroplated with tin-lead solder to a thickness of 7 micro-meters. The resulting laminate is used as the cathode in an electrodeposition bath equipped with a stainless steel anode and containing Resin III (100 parts), 2-n-butoxyethanol (40 parts) and aqueous 20% lactic acid (7.6 parts) in water (252.4 parts). A voltage of 10 volts is applied for one minute and the laminate is then removed from the bath, rinsed with water and dried at 110° C. for 5 minutes. The electrodeposited film coats the areas where there is tin-lead solder. The dried laminate is immersed in a bath of HOECHST HB 1160 DRY FILM STRIPPER at 50° C. This treatment removes the photoresist leaving the electrodeposited polymer film. The copper exposed by removing the Photoresist is etched away by immersion in an etching bath containing a solution of ammonium persulphate (150 parts) in water (850 parts) at 50° C. The etched laminate is rinsed in water and dried to leave a clear pattern, in copper coated with tin-lead solder and covered with the electrodeposited film, on the laminate base. A layer of the epoxide resin used as starting material for the preparation of Resin 111 is applied in solution in organic solvent as a solder mask over the surface bearing the solder-plated copper pattern using a wire-wound rod. The solder mask layer is dried at 110° C. for 5 minutes and then irradiated through an image-bearing transparency using a 5kW metal halide lamp at a distance of 75 cm for one minute. This irradiation co-cures the exposed areas of the solder mask resist and the areas of the electrodeposited film underlying such exposed areas. The irradiated laminate is immersed in a mixture of propylene carbonate (50 parts), gamma-butyrolactone (20 parts) and butyl digol (30 parts) to remove the areas of the solder mask not exposed in the imagewise irradiation and the electrodeposited resin thereby exposed in those areas. The resulting laminate has a Pattern of Photocured solder mask securely bonded to the underlying copper pattern through the cured intermediate electrodeposited film.

EXAMPLE 4

A copper-clad laminate coated with RISTON 3415 negative photoresist, which has been imaged and developed to form a pattern in the photoresist, thereby leaving areas where the copper is exposed, is used as the cathode in an electrodeposition bath equipped with a stainless steel anode. The bath contains a solution of Resin IV (100 parts), aqueous 20% lactic acid (17.1 parts) and triphenylsulphonium hexafluoroantimonate (11.7 parts) in a mixture of 2-n-butoxyethanol (29.3 parts) and water (428.4 parts). A current is passed at 5 volts for one minute and the laminate is then removed from the bath, rinsed with water and dried at 110° C. for 5 minutes. The electrodeposited film coats the areas where the copper is exposed. The dried laminate is immersed in aqueous 7% ethanolamine solution at 50° C. to remove the photoresist, leaving the electrodeposited film. The copper exposed by removing the photoresist is etched away by immersion in ferric chloride solution at 30° C. The etched laminate is rinsed in water and dried to leave a clear pattern,. in copper covered with the electrodeposited polymer film,. on the laminate base. A 12 micrometer layer of 3.1-epoxycyclohexyl-methyl-3',4'-cyclohexanes-carboxylate containing 5% triphenylsulphonium hexafluoroantimonate is applied to the surface bearing the copper pattern using a wire-wound rod. It is irradiated through an image-bearing transparency using a 5kW metal halide lamp at a distance of 75 cm for 10 minutes to co-cure exposed areas of the mask and areas of the electrodeposited film underlying such exposed areas. The irradiated laminate is immersed in a mixture of propylene carbonate (50 parts), gamma-butyrolactone (20 parts) and butyl digol (30 parts) to remove the areas of the mask and electrodeposited film not exposed in the imagewise irradiation. The resulting laminate has a pattern of photocured resist securely bonded to the underlying copper pattern through the cured intermediate electrodeposited film.

We claim:

1. A method of making a pattern of an electrically conductive material which comprises
   (i) electrodepositing on an electrical conductive surface a film comprising a photocurable organic resin,
   (ii) forming on the electrodeposited film a predetermined pattern of a resist co-cured with underlying areas of the electrodeposited film by exposure to actinic radiation, by
      (a) applying a layer of the resist over the electrodeposited film,
      (b) irradiating the resist layer with actinic radiation in a predetermined pattern, thereby photocuring the resist and the underlying electrodeposited film in exposed areas, and
      (c) removing unexposed areas of the irradiated resist layer, thereby leaving predetermined areas of the electrodeposited film uncovered, and
   (iii) removing the uncovered areas of the electrodeposited film by treatment with a solvent therfor, thereby forming a surface comprising bare conductive material in predetermined areas and, in other predetermined areas, photocured resist securely bonded to the electrically conductive surface through the cured areas of the electrodeposited film covered by the resist.

2. A method according to claim 1, in which the electrodeposited film and the resist are cured by photocrosslinking effected by direct activation of photosensitive groups therein on exposure to actinic radiation.

3. A method according to claim 2, in which the electrodeposited film comprises a reaction product of an epoxide resin containing an alpha, beta-ethylenically unsaturated ketone group having aromaticity or ethylenic unsaturation in conjugation with the alpha, beta unsaturation and a secondary monoamine, and the resist comprises an epoxide resin having said conjugated unsaturated ketone group.

4. A method according to claim 3, in which said epoxide resins are each a polyglycidyl ether of a 1,5-bis(hydroxyphenyl)penta-1,4-dien-3-one or an advancement reaction product thereof with a bisphenol or a hydantoin, or an advancement reaction product of a bisphenol diglycidyl ether or a N,N'-diglycidylhydantoin with a 1,5-bis(hydroxyphenyl)penta-1,4-dien-3-one.

5. A method according to claim 1, in which the electrodeposited film and the resist are cured by free radical initiated polymerisation, the electrodeposited film or the resist containing a free radical photopolymerisation initiator.

6. A method according to claim 5, in which the electrodeposited film contains polymerisable acrylic groups together with a salt-forming group.

7. A method according to claim 5, in which the electrodeposited film comprises a mixture of an acrylic polymer having a carboxyl or a tertiary amino group with a monomer having at least two acrylate or methacrylate groups.

8. A method according to claim 6, in which the resist comprises a material having, on average, more than one polymerisable acrylic group per molecule.

9. A method according to claim 8, in which the resist is developable in aqueous alkali and has polymerisable acrylic groups and at least one carboxyl group.

10. A method according to claim 1, in which the electrodeposited film and the resist are cured by cationic polymerisation in the presence of a cationic photopolymerisation initiator.

11. A method according to claim 10 in which the electrodeposited film comprises a resin obtained by reacting a secondary monoamine with part of the glycidyl group content of a copolymer of a monoacrylic monomer containing a glycidyl group with at least one other vinyl monomer.

12. A method according to claim 11, in which the resist comprises an epoxide resin together with an onium salt, a metallocenium salt or an aromatic iodosyl salt.

* * * * *